United States Patent [19]

Mahulikar et al.

[11] Patent Number: 5,608,267

[45] Date of Patent: *Mar. 4, 1997

[54] MOLDED PLASTIC SEMICONDUCTOR PACKAGE INCLUDING HEAT SPREADER

[75] Inventors: Deepak Mahulikar, Madison; Derek E. Tyler, Cheshire, both of Conn.; Jeffrey S. Braden, Livermore, Calif.; James M. Popplewell, Guilford, Conn.

[73] Assignee: Olin Corporation, Manteca, Calif.

[*] Notice: The term of this patent shall not extend beyond the expiration date of Pat. No. 5,367,196.

[21] Appl. No.: 276,381

[22] Filed: Jul. 18, 1994

Related U.S. Application Data

[63] Continuation-in-part of Ser. No. 946,119, Sep. 17, 1992, Pat. No. 5,367,196.

[51] Int. Cl.$^6$ .................................................. H01L 23/28
[52] U.S. Cl. ......................... 257/796; 257/787; 257/706
[58] Field of Search .................................... 257/787, 796, 257/706

[56] References Cited

U.S. PATENT DOCUMENTS

| | | | |
|---|---|---|---|
| 3,399,332 | 8/1968 | Savolainen | 257/706 |
| 3,770,600 | 11/1973 | Sautter et al. | 204/58 |
| 3,784,440 | 1/1974 | Grunwald et al. | 161/185 |
| 3,930,114 | 12/1975 | Hodge | 174/52 FP |
| 4,092,697 | 5/1978 | Spaight | 361/688 |
| 4,121,980 | 10/1978 | Gohausen et al. | 204/35 N |
| 4,461,924 | 7/1984 | Butt | 174/52 P |
| 4,569,692 | 2/1986 | Butt | 75/235 |
| 4,589,010 | 5/1986 | Tateno et al. | 257/666 |
| 4,640,625 | 2/1987 | Kushida | 368/280 |
| 4,707,724 | 11/1987 | Suzuki et al. | 257/678 |
| 4,713,150 | 12/1987 | Hornbostel et al. | 204/38.3 |
| 4,766,095 | 8/1988 | Hiroshi | 437/217 |
| 4,767,674 | 8/1988 | Shirai et al. | 428/461 |
| 4,793,967 | 12/1988 | Pryor et al. | 419/19 |
| 4,811,166 | 5/1989 | Alvarez et al. | 361/688 |
| 4,840,654 | 6/1989 | Pryor | 65/18.1 |
| 4,882,212 | 11/1989 | SinghDeo et al. | 428/76 |
| 4,888,449 | 12/1989 | Crane et al. | 174/52.4 |
| 4,926,242 | 5/1990 | Itoh et al. | 257/706 |
| 4,939,316 | 7/1990 | Mahulikar et al. | 174/524 |
| 4,994,314 | 2/1991 | Rosenfeld et al. | 428/36.92 |
| 4,996,115 | 2/1991 | Eerkes et al. | 428/614 |
| 5,001,546 | 3/1991 | Butt | 257/666 |
| 5,013,871 | 5/1991 | Mahulikar et al. | 174/52.4 |
| 5,015,083 | 5/1991 | Mahulikar et al. | 174/52.4 |
| 5,035,940 | 7/1991 | Winton et al. | 428/174 |
| 5,043,535 | 8/1991 | Lin | 257/678 |
| 5,055,967 | 10/1991 | Sukonnik et al. | 361/680 |
| 5,066,368 | 11/1991 | Pasqualoni et al. | 204/58 |
| 5,073,521 | 12/1991 | Braden | 437/209 |
| 5,096,508 | 3/1992 | Breedis et al. | 148/13.2 |
| 5,098,796 | 3/1992 | Lin et al. | 428/607 |
| 5,098,864 | 3/1992 | Mahulikar | 437/221 |
| 5,122,858 | 6/1992 | Mahulikar et al. | 257/666 |
| 5,124,783 | 6/1992 | Sawaya | 257/678 |
| 5,181,969 | 1/1993 | Komatsubara et al. | 148/552 |
| 5,188,985 | 2/1993 | Medeiros et al. | 437/218 |
| 5,272,375 | 12/1993 | Belopolsky | 257/717 |
| 5,300,158 | 5/1994 | Chen et al. | 148/258 |
| 5,367,196 | 11/1994 | Mahulikar et al. | 257/787 |

FOREIGN PATENT DOCUMENTS

| | | | |
|---|---|---|---|
| 57-139949 | 10/1981 | Japan | 257/796 |
| 60-137041 | 7/1985 | Japan | 257/796 |
| 61-39555 | 2/1986 | Japan . | |

OTHER PUBLICATIONS

Metals Handbook, Ninth Edition, vol. 5 "Surface Cleaning, Finishing, and Cleaning", pp. 600–607, 1982.

Primary Examiner—Mahshid D. Saadat
Assistant Examiner—T. M. Arroyo
Attorney, Agent, or Firm—Gregory S. Rosenblatt

[57] ABSTRACT

There is provided a molded plastic electronic package having improved thermal dissipation. A thermal dissipator, such as a heat spreader or a heat slug is partially encapsulated in the molding resin. The thermal dissipator has a density less than that of copper and a coefficient of thermal conductivity that is constant or increases as the package periphery is approached.

20 Claims, 4 Drawing Sheets

MOLDED PLASTIC SEMICONDUCTOR PACKAGE INCLUDING HEAT SPREADER

CROSS REFERENCE TO RELATED APPLICATION

This patent application is a continuation-in-part of U.S. patent application Ser. No. 07/946,119 entitled "Molded Plastic Semiconductor Package Including an Aluminum Alloy Heat Spreader" by Deepak Mahulikar et al, filed Sep. 17, 1992, that is now U.S. Pat. No. 5,367,196.

BACKGROUND OF THE INVENTION

The present invention relates to a molded plastic package for encapsulating a semiconductor device. More particularly, a heat slug is at least partially embedded in a molding resin to enhance the dissipation of heat from the device.

Molded plastic electronic packages provide environmental protection to integrated circuit devices. Packages such as the PQFP (plastic quad flat package) and PLCC (plastic leaded chip carrier) protect an encapsulated device from contaminants such as moisture and from mechanical shock.

One molded plastic package is illustrated in U.S. Pat. No. 4,707,724 to Suzuki et al, which is incorporated by reference in its entirety herein. The Suzuki et al. package has a leadframe with a centrally positioned die attach pad. A semiconductor device is bonded to the pad and electrically interconnected to the inner ends of the leadframe. A polymer molding resin encapsulates the device, die attach pad and inner lead ends.

One disadvantage with molded plastic packages is poor thermal dissipation. During operation, the semiconductor device generates heat which must be removed to maintain the operating integrity of the device. Some heat is dissipated through the bonding wires and leadframe, the remainder is absorbed into the molding resin. The molding resin is a poor thermal conductor so the device temperature increases. To prevent the device from overheating, the power provided to the device must be limited.

One way to improve the dissipation of heat from a semiconductor device is to incorporate a heat slug into the molded plastic package. The heat slug provides an enhanced path for thermal dissipation. As a result, more power may be provided to the semiconductor device without a resultant excessive increase in device temperature.

Heat spreaders and heat slugs are both thermally conductive structures embedded in a molding resin to enhance the dissipation of heat from a semiconductor device. Heat spreaders are completely encapsulated within the molding resin while heat slugs have at least one surface exposed to the outside environment. While the present invention will be described particularly in terms of a heat slug, all embodiments contained herein are equally applicable to heat spreaders and the term "thermal dissipator" encompasses heat slugs, heat spreaders and related structures.

The heat slug is usually nickel plated copper and will either be in direct contact with the semiconductor device or separated from the device by molding resin.

The heat slug is distinguished from a die attach pad. The die attach pad is formed from the same material as the leadframe and is the same thickness as the leads, generally between 0.13 millimeter and 0.51 mm (0.005–0.020 inch). The thin die attach pad has a limited heat capacity and its effectiveness in removing heat from a device is limited by the thermal conductivity of the molding resin. Heat slugs are not unitary with the leadframe and are, usually, thicker than the leadframe. This extra thickness enhances the thermal capacity of a heat slug increasing the capacity of the heat slug to remove heat from an integrated circuit device.

Copper heat slugs provide the molded plastic package with improved dissipation capability and are low cost. However, during solder plating of the leads, the solder wets the heat slug. This excess solder reflows during soldering of the leads to a printed circuit board and can cause an electrical short circuit between leads or between the heat slug and circuit traces on the printed circuit board.

Other disadvantages with copper heat slugs include:

The electrical conductivity of the heat slug does not provide electrical insulation between an electronic device and external circuitry.

The weight of copper (density=8.93 g/cm$^3$) increases the weight of a molded plastic package.

The coefficient of thermal expansion of copper is about three times that of silicon. Direct bonding of a silicon based integrated circuit device to a copper heat slug induces strain in the device. During temperature cycling this strain may cause silicon fracture.

The interface between the heat slug and a polymer molding resin is a site for the ingress of moisture. The moisture expands due to temperature increases and the package base can swell or fracture (the "popcorn effect").

The copper and nickel plate do not match the, typically, black color of most molding resins. The molding resin absorbs infrared (I.R.) radiation during I.R. solder reflow at a different rate than the metallic surfaces. The resultant localized heating can induce strains in the package during soldering.

Other than copper, heat slugs are formed from clad metals having a copper or aluminum component as disclosed in U.S. Pat. No. 5,015,803 to Mahulikar et al, which is incorporated in its entirety herein by reference.

One method to improve the adhesion of electronic package components to a molding resin is to form a plurality of grooves to mechanically lock the resin as disclosed in U.S. Pat. No. 4,589,010 to Tateno et al. Alternatively, the component is coated with a material having better adhesion to the molding resin as disclosed in U.S. Pat. No. 4,888,449 to Crane et al.

These approaches do not reduce the weight of the package and do not maximize the transfer of heat from a semiconductor device to a surface of the package.

SUMMARY OF THE INVENTION

Accordingly, it is an object of the invention to provide a molded plastic electronic package having a partially embedded thermal dissipator that has lower weight and/or improved adhesion to a polymer molding resin than a nickel coated copper heat slug. An additional objective is for the heat slug to be electrically nonconductive. In certain embodiments of the invention, the coefficient of thermal expansion is closer to that of silicon than to that of copper. It is a feature of the invention that the thermal resistance between a semiconductor device and the heat spreader is minimized by the use of a thermal grease or a polymer adhesive, such as a B-staged epoxy. Yet another feature of the invention is that in some embodiments the heat spreader is at least partially coated with an anodization layer. It is an advantage of the invention that this anodization layer provides a uniformly rough surface having improved adhesion to the molding resin. Yet another advantage of the heat spreader is that its weight is significantly less than that of a similar geometry copper heat spreader.

In accordance with the invention, there is provided a semiconductor package. The package encapsulates at least one semiconductor device. A thermal dissipator having a first side adjacent to the semiconductor device and an opposing second side is also at least partially encapsulated by the molding resin. The thermal dissipator has a density less than the density of copper and a coefficient of thermal conductivity that is constant or increases from the first side to the second side. An electrical interconnection is provided between the semiconductor device and the exterior of the semiconductor package.

The above stated objects, features and advantages will become more apparent from the specification and drawings which follow.

DESCRIPTION OF THE PREFERRED EMBODIMENTS

Figure 1:
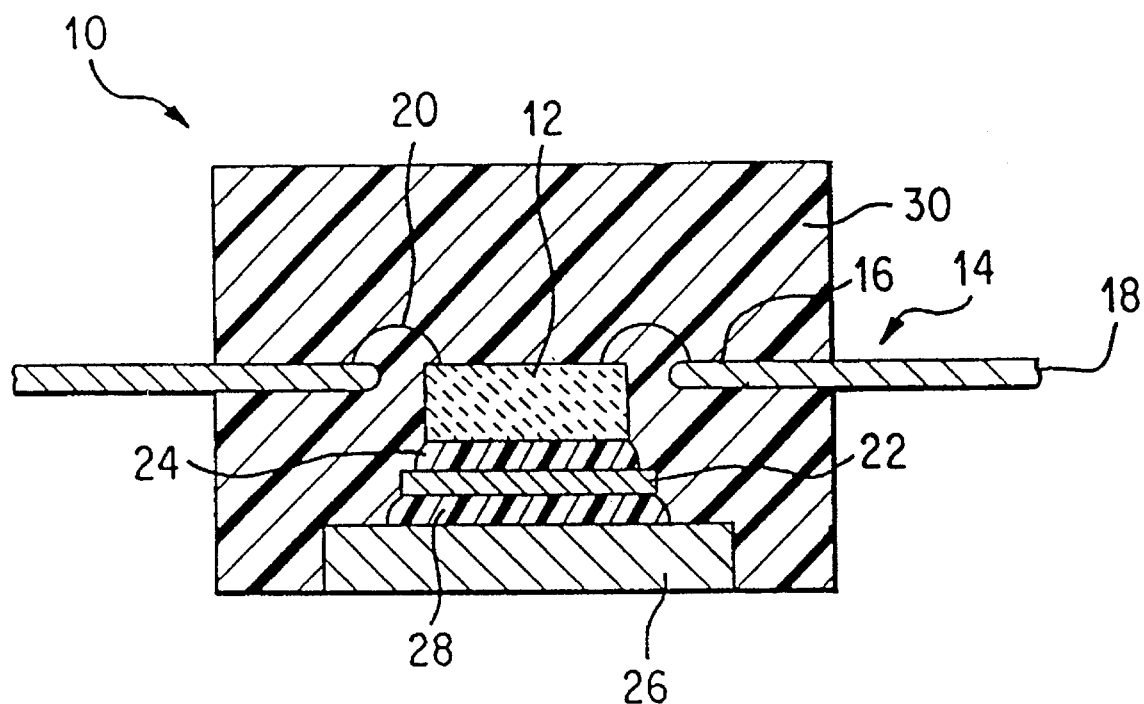
FIG. 1 shows in cross-sectional representation a molded plastic package incorporating a heat spreader as known from the prior art.

FIG. 1 shows in cross-sectional representation a molded plastic package 10 encapsulating a semiconductor device 12 as known from the prior art. The molded plastic package 10 includes a leadframe 14 having a plurality of inner lead ends 16 and outer lead ends 18. The inner lead ends 16 are electrically interconnected to the semiconductor device 12 by bond wires 20. The bond wires 20 are small, typically on the order of 0.025 millimeter (0.001 inch), diameter wires manufactured from gold, copper or an alloy thereof. Alternatively, instead of bond wires, thin strips of copper foil such as utilized in tape automated bonding (TAB) may be utilized. The semiconductor device 12 is bonded to a die attach pad 22 formed from the same material as the leadframe 14 and centrally positioned within an aperture defined by the inner lead ends 16. The semiconductor device 12 is joined to the die attach pad 22 by a first bonding means 24 such as a low melting temperature solder (for example, alloys of gold and tin or of lead and tin) or a polymer adhesive. Preferably, if a polymer adhesive is used, the first bonding means 24 is made thermally conductive through the addition of a metal powder such as silver.

The die attach pad 22 is then bonded to a heat slug 26 by a second bonding means 28. The heat slug 26 is usually fashioned from copper or a copper alloy to maximize thermal dissipation and may be a clad material.

A second bonding means 28 is any suitable solder or adhesive. As above for the first bonding means, the second bonding means 28 may be filled with a metallic powder to enhance thermal dissipation. The semiconductor device 12, inner lead ends 16, die attach pad 22, first 24 and second 28 bonding means, as well as a portion of the heat slug 26 are then encapsulated in a molding resin 30.

Figure 2:
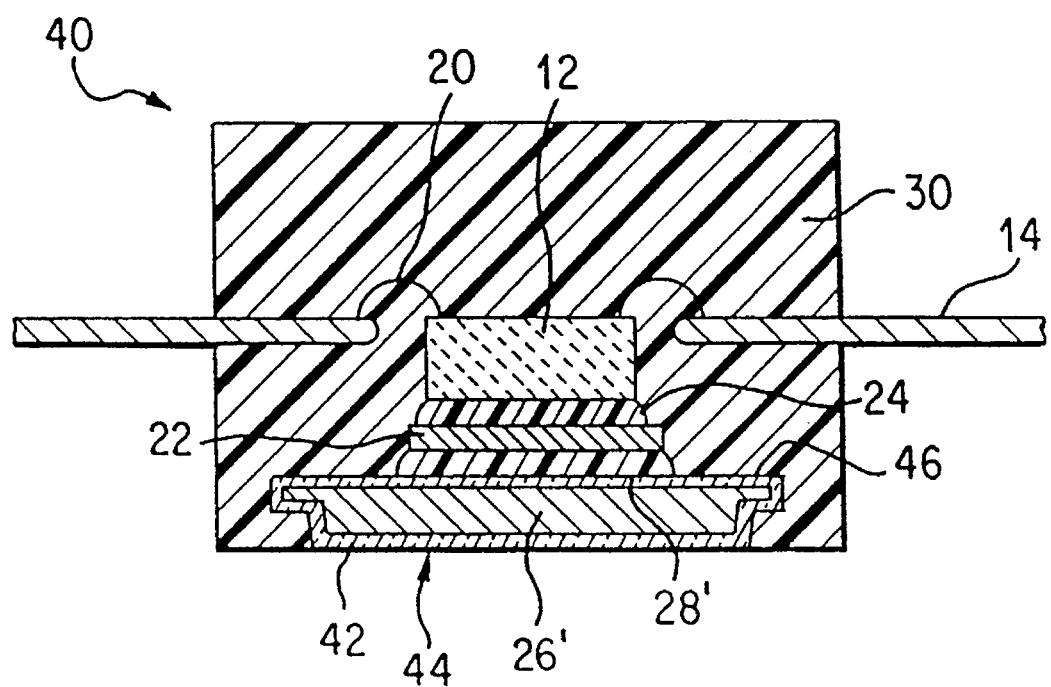
FIG. 2 shows in cross-sectional representation a molded plastic package incorporating an aluminum heat spreader in accordance with an embodiment of the invention.

A molded plastic electronic package 40 representing a first embodiment of the invention is illustrated in cross-sectional representation in FIG. 2. Those features of the molded plastic package 40 which perform substantially the same function as structures illustrated in FIG. 1 are identified by like reference numerals. Those features of the molded plastic package 40 which perform related functions in a different manner are indicated by primed reference numerals.

An aluminum or aluminum alloy thermal dissipator 26' is, preferably, in thermal contact with a semiconductor device 12. By thermal contact, it is meant that the heat generated by the semiconductor device 12 can travel a continuous path to an external surface 44 of the aluminum or aluminum alloy heat spreader 26' without passing through the molding resin 30.

Molding resin is a poor thermal conductor. Maintaining thermal contact between the device and the thermal dissipator, in accordance with the preferred embodiments of the invention, improves thermal dissipation. The molding resin 30 preferably only partially encapsulates the heat slug 26'. One exterior surface 44 of the heat slug 26' is, preferably, not encapsulated to maximize thermal transfer of heat generated by the device to the surrounding environment. Although, a fully encapsulated heat spreader is within the scope of the invention.

The semiconductor device 12 is bonded to a die attach pad 22 by means of a first bonding means 24. A second bonding means 28' joins the die attach pad 22 to the aluminum or aluminum alloy heat slug 26'. The second bonding means 28' may be a low melting temperature solder or polymer adhesive as known from the prior art, a thermally conductive grease, or a B-stage epoxy as described below. It is also desirable to maintain thermal contact between the heat spreader and the printed circuit board or other external structures to enhance heat removal. A thermal grease may be utilized, or, if the heat spreader is electrically non-conductive, a solder may be employed.

The aluminum or aluminum alloy heat slug 26' is anodized. An anodization layer 42 improves both corrosion resistance and adhesion to the molding resin 30. While the anodization layer may be any color or transparent, black (shades of black through gray) is preferred. Black radiates the most heat and is most effective for dissipating heat from the package to the surrounding environment. A black color also matches the typical color of the molding resin. As a result, the infrared absorption characteristics of the package are not affected by the heat slug. During reflow soldering, the package of the invention presents the same temperature profile as packages lacking a heat spreader.

The black color of the anodization layer 42 may be formed by the addition of dyes or pigments, but the most durable color is formed by integral color anodization as disclosed in U.S. Pat. No. 5,066,368 to Pasqualoni et al. Following anodization, the coating layer may be sealed to close the pores inherent in anodization. One suitable sealing process is exposure to pressurized steam for 30–60 minutes. It may be preferred not to seal the pores as mechanical locking of the molding resin in the pores improves adhesion.

The aluminum alloys most suitable for black integral color anodization are those designated by the ASM (American Society for Metals) as 3xxx and 6xxx series.

Alloys of the 3xxx series contain up to about 1.5 percent by weight manganese along with other alloying elements. The alloys are characterized by good thermal conductivity and about 20% higher strength than alloys designated as 1xxx series (having greater than 99.00% aluminum).

Alloys of the 6xxx series contain magnesium and silicon in an approximate proportion to form $Mg_2Si$. The alloys are characterized by good formability and good machinability. They are heat treatable and form a precipitation hardened alloy.

A most preferred aluminum alloy is aluminum alloy 3003 which has a nominal composition of about 0.12 percent by weight copper, about 1.2 percent by weight manganese and the balance aluminum. A black anodization layer may be formed by integral color anodization in an electrolyte containing a mixture of sulfuric and sulfosalicylic acids in a concentration range of from about 1–4 g/l $H_2SO_4$ and from about 50–120 g/l $C_7H_6O_6S$. The cell voltage is rapidly increased such that the current density increases from zero to over 7.5 $A/dm^2$ (70 ASF) within about 3 minutes.

The adhesion of the molding resin to the anodized heat spreader is further enhanced by mechanical locking. By proper control of the anodization parameters, pores of a desired size form in the anodization layer. A pore size of from about 50 to about 500 angstroms provides enhanced adhesion without weakening the strength of the layer. A preferred pore size is from about 75 to about 200 angstroms.

The minimum thickness of the anodization layer 42 is that effective to prevent corrosion of the heat spreader 26'. The anodization layer 42 should be as thin as possible while retaining effectiveness because the metal substrate is a better thermal conductor than the anodization layer. A preferred thickness for the anodization layer 42 is from about 0.0025 mm to about 0.076 mm (0.1–3 mils), with the preferred thickness being from about 0.013 mm to about 0.026 mm (0.5–1.0 mils).

The advantages of the aluminum or aluminum alloy heat spreader include a weight of about 60% less than that of a comparable copper or copper alloy heat spreader. Surprisingly, as disclosed in U.S. Pat. No. 4,939,316 to Mahulikar et al., the thermal dissipation of an electronic package with aluminum base components is comparable to that of a similarly configured package having copper base components. The reason for this is believed to be that the limiting factor for the dissipation of heat from the semiconductor device 12 to the surface 44 of the heat spreader 26' is thermal conduction through the first 24 and second 28' bonding means. Packages having an aluminum or aluminum alloy heat spreader are capable of removing approximately the same amount of heat from the device as a comparable package with a copper heat spreader.

The anodization layer 42 provides the heat spreader 26' with resistance to salt spray corrosion, as well as resistance to other corrosives. A black color provides better thermal conduction than a reflective metallic surface such as a copper, aluminum or nickel. Additionally, by varying the peak current density during anodization, controlled diameter pores may be formed in the surface of the anodization layer 42. These pores provide improved mechanical locking to the molding resin 30.

The improvement in adhesion when an aluminum heat spreader is anodized as compared to a non-anodized component is believed to be based on both a chemical interaction with the molding resin and mechanical locking. A rough anodization layer, achieved by varying the anodization parameters (ie. current or solution make-up) provides better adhesion than a smooth anodized surface.

Another advantage of the anodization layer 42 is electrical isolation. The anodized aluminum heat spreader is electrically nonconductive. A semiconductor device mounted on the heat spreader will not be at the same voltage potential as the heat spreader and a voltage pulse contacting the outside of the package will not detrimentally affect the semiconductor device. Further, when the outer lead ends are electrolytically plated with solder, a typical operation following package molding, the electrically nonconductive heat spreader will not be coated with solder.

The adhesion of the heat slug 26' to the molding resin is further improved by mechanical locking. As shown in FIG. 2, the corners of an upper surface 46 of the heat slug 26' may extend beyond the corners of the bottom surface 44 such that the molding resin partially encapsulates the heat slug. It is desirable that the bottom surface 44 remain exposed to the atmosphere to maximize the dissipation of heat. Other configurations may also be employed to mechanically lock the heat slug in place in the epoxy molding resin, such as protrusions, holes or edge deformations.

The thermal dissipation of the molded plastic package 40 may be further improved by using as the second bonding means 28' a thermal grease or a thermally conductive polymer adhesive, such as a B-stage epoxy. The thermal grease 28' is any suitable thermally conductive grease such as a silicone grease. One exemplary thermal grease is Omegatherm 24 manufactured by Omega Engineering, Inc. of Stamford, Conn.

When the thermal grease is utilized, the die attach paddle 22 remains in thermal contact with the heat slug 26', but is not bonded to it. As a result, the coefficient of thermal expansion mismatch between the heat spreader 26' and the semiconductor device 12 will not generate mechanical stresses on the semiconductor device 12. Any stresses generated by the coefficient of thermal expansion mismatch are compensated by movement of the die attach paddle. Thermal contact is maintained by corresponding movement of the thermal grease.

The advantages achieved through the thermal grease are not limited to aluminum heat spreaders and improve any electronic package having a coefficient of thermal expansion mismatch between the heat spreader and the semiconductor device. The grease is particularly useful for copper or copper alloy heat spreaders. To enhance adhesion, the copper heat spreaders are preferably coated with a second metal such as nickel as disclosed in U.S. Pat. No. 4,888,449.

Alternatively, the die attach pad 22 may be bonded to the aluminum or aluminum alloy heat slug 26' by a thermally enhanced polymer adhesive such as a silver filled epoxy. In one embodiment, the upper surface 46 of the heat slug 26' is precoated with a layer of a conductive adhesive 28' in form of a film or thin layer of liquid and cured to the B-stage. By "B-stage" it is meant the epoxy is partially cured. Adhesion to the die attach pad 26' occurs without completion of the cure reaction.

The heat slug 26' with the polymer adhesive 28' laminated thereto is placed in a mold cavity. Next, the leadframe assembly which includes the semiconductor device 12 and die attach pad 22 is placed into the mold. The leadframe assembly and the aluminum or aluminum alloy heat slug 26' except for the bottom surface 44 are then encapsulated in a molding resin 30 such as by injection molding. The molding resin is heated to decrease viscosity during molding and the heated resin either completes the cure or at least partially cures the polymer adhesive 28'. Complete curing of the polymer adhesive 28' if required, occurs during a post mold cure. One exemplary post mold cure is to heat the molded package to about 175° C. in air for several hours.

Preferred polymer adhesives have a very low weight loss (i.e. the adhesive has little out gassing) so that air bubbles or voids do not form during the mold and post cure. The polymer adhesive should also be very low stress, i.e., have a high degree of compliancy to compensate for the coefficient of thermal expansion mismatch between the aluminum or aluminum alloy heat slug 26' and the semiconductor device 12. A preferred, thickness for the polymer adhesive is from about 0.025 mm to about 0.51 mm (0.001–0.020 inch), with a preferred thickness of from about 0.051 mm to about 0.25 mm (0.002–0.010 inch).

In addition to aluminum, other suitable materials for the thermal dissipator have a density, at room temperature (20° C.), less than that of copper (8.93 g/cm$^3$) or predominantly copper metal alloys to minimize the weight of the molded plastic package. The thermal dissipator preferably has a density less than about 8 g/cm$^3$ and most preferably less than about 5 g/cm$^3$. The coefficient of thermal conductivity of the thermal dissipator 26' from a first side 46 adjacent to the semiconductor device 12 to the opposing second side 44 is either constant or increasing.

In some embodiments, it is desirable for the thermal dissipator to have a coefficient of thermal expansion (C.T.E.) closer to that of silicon than copper. Preferably, the C.T.E. is mo more than twice that of the semiconductor device and most preferably, within about 20% that of the semiconductor device.

In other embodiments, such as when the inner lead portions are bonded to the thermal dissipator, it is desirable for the thermal dissipator to have a C.T.E. about equal to that of the leadframe, which is typically copper.

The thermal dissipator is also electrically nonconductive with a dielectric constant less than about 40 and preferably in excess of about 15.

Any of the above metal, alloys or composites may be coated with a thermally conductive material such as 0.0013 mm to 0.025 mm (0.00005–0.001 inch) thick layer of diamond film. The diamond film is usually applied by sputtering or vapor deposition.

Light weight metals capable of anodization constitute one group of thermal dissipators. This group includes anodizable metals such as titanium (density=4.51 g/cm$^3$), zinc (density=7.13 g/cm$^3$), magnesium (density=1.74 g/cm$^3$) and anodizable alloys of these metals.

Titanium is most preferred because the metal is readily available and easy to form into a desired shape by mechanical processes such as stamping. Titanium is anodized by many of the same commercial solutions, containing sulfuric acid, used to anodize aluminum.

The oxide film formed by anodization has good adhesion to a polymer molding resin due to the oxide surface providing chemical affinity and macroscopic surface roughness providing mechanical locking. The thickness of the oxide film is less than about 0.07 mm (0.003 inch) to minimize thermal resistance. Preferably, the thickness of the anodization layer is from about 0.008 mm to about 0.04 mm (0.0003–0.0015 inch) and more preferably from about 0.012 mm to about 0.025 mm (0.0005–0.001 inch).

A second group of suitable materials are composites such as aluminum/silicon carbide, aluminum/aluminum oxide, aluminum/aluminum nitride and aluminum/graphite. The composites are formed by combining a metal powder with a ceramic powder and bonding the two together by a combination of heat and pressure. As disclosed in U.S. Pat. No. 4,882,212 to SinghDeo et al, which is incorporated by reference in its entirety herein, the composites, optionally including a glass binder, can be tailored to be electrically conductive or electrically nonconductive. The coefficient of thermal expansion can be tailored to a desired value.

The properties of the composite may be gradated by changing the metal/ceramic ratio. For example, it may be desirable to have the first surface 46 as electrically conductive for use as a ground plane or interposer. Alternatively, it may be desirable to form the second surface 44 to have an increased coefficient of thermal conductivity to enhance the flow of heat from the electronic package.

The composites can be coated with an external metal layer, as disclosed in U.S. Pat. No. 5,043,535 to Lin which is incorporated by reference in its entirety herein, to improve hermeticity. The composite is combined with a coating powder and a dense shot medium. When rotated in a drum, the shot drives the coating powder into the surface of the composite. When the metallic powder is aluminum, an anodization layer can be formed.

Other suitable composites include thermally conductive fibers in a polymer matrix. A preferred composite is an epoxy matrix filled with from about 50% to about 95% by volume carbon fibers.

Copper or other metals may be made more corrosion resistant by forming a nitride, carbide or carbon nitride surface on the metal eliminating the need to nickel plate. While some metals such as steel may be nitrided or carbided by exposure to the proper high temperature atmosphere, copper requires additional processing. As disclosed in U.S. Pat. No. 5,096,508 to Breedis et al, a base alloy CuQ may be nitrided if Q is selected to be an element both soluble in copper and reactive with nitrogen. Typically, Q is from about 1% to about 10% by weight of one or more elements selected from the group titanium, aluminum, chromium, zirconium and silicon. The thickness of the nitride or carbide film is generally from about 10 angstroms to about 1 micron.

If electrical isolation is required, the nitride, carbide or carbonitride layer may be coated with a thin layer of an insulator such as aluminum oxide. The insulator can be deposited by any known means such as PVD (physical vapor deposition).

Figure 3:
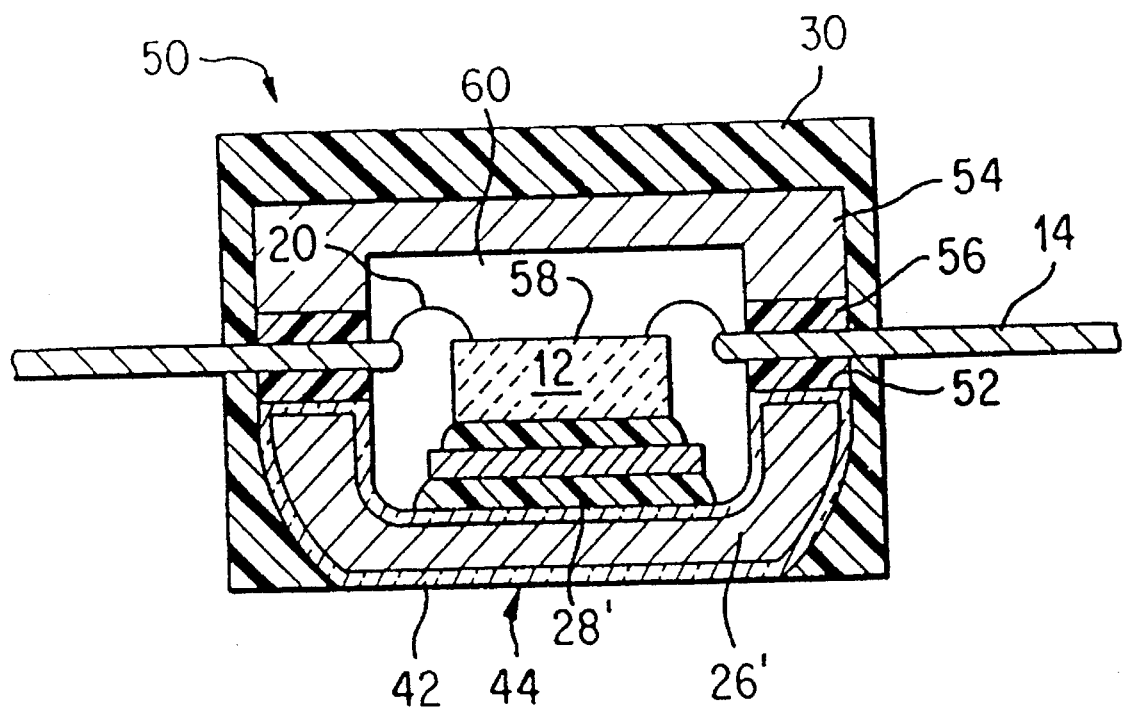
FIG. 3 shows in cross-sectional representation a molded plastic package incorporating an aluminum heat spreader in accordance with a second embodiment of the invention.

A molded plastic package 50 as illustrated in cross-sectional representation in FIG. 3 represents another embodiment of the invention. The heat slug 26' which is preferably aluminum and includes a black integral color anodization layer 42, is bonded to the leadframe 14 by a third bonding means 52. The third bonding means 52 may be any suitable electrically insulating means such as a polymer adhesive. A preferred third bonding means 52 is an epoxy such as Abelstik 550 (Abelstik Laboratories, Gardenia, Calif.). Preferably, a cover 54 is bonded to the opposite side of the leadframe 14 by a fourth bonding means 56. The cover 54 may be fashioned from any suitable material such as ceramic, plastic, glass or metal. Most thermal dissipation is through the bottom surface 44 of the heat spreader 26' so the thermal conduction characteristics of the cover 54 are not critical. More importantly, the cover 54 should have a coefficient of thermal expansion approximately matching that of the heat spreader 26' to avoid flexure during package heating or cooling. In the preferred embodiment, the cover 54 is also formed from aluminum or an aluminum alloy.

The fourth bonding means may be any electrically insulating means such as a polymer adhesive. The assembly is then encapsulated within a molding resin 30 with the bottom surface 44 of the heat spreader 26' exposed to the atmosphere to maximize thermal dissipation. The advantage of this embodiment is that the electrically active face 58 of the semiconductor device 12 and the bond wires 20 do not contact the molding resin 30. During package encapsulation, the molding resin 30 is hot and traveling at high velocity. Contact with the electrically active face 58 may abrade the electrical circuits formed on that face or break bond wires 20. After molding, the cured resin 30 has a coefficient of thermal expansion different than that of the semiconductor device 12. During temperature fluctuations, there is movement of the semiconductor device 12 relative to the molding resin 30. The cover 54 creates a cavity 60 protecting the electrically active face 58 of the semiconductor device 12, as well as the bond wires 20 from contact with the molding resin 30.

While an uncoated aluminum or aluminum alloy heat spreader may provide some of the advantages described above, the full advantage of the invention is achieved with an anodized aluminum heat spreader. A black integral color maximizes thermal conduction from the exposed face of the heat spreader. The anodization layer improves the adhesion between the heat spreader and the molding epoxy as is apparent from the Example which follows. The Example is intended to be illustrative and not limiting.

EXAMPLE

Figure 4:
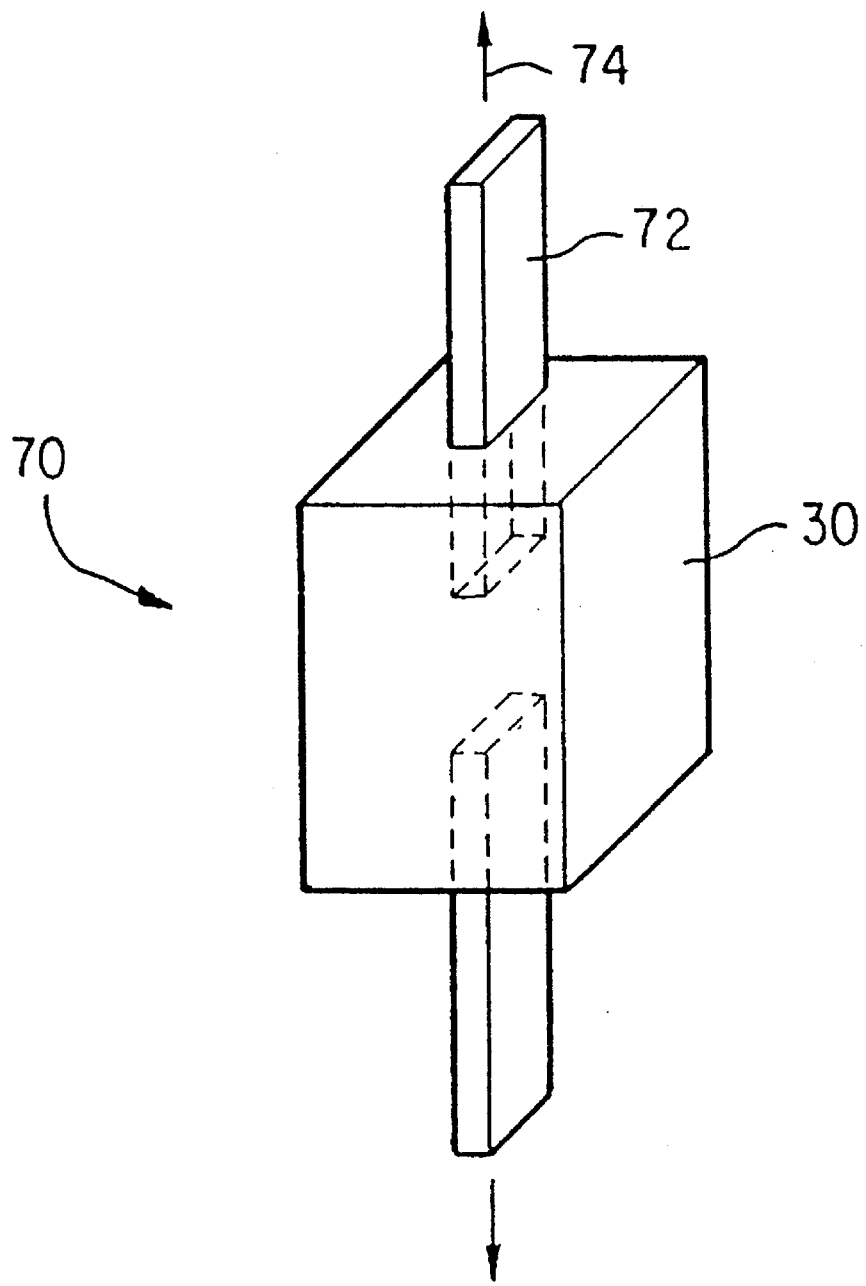
FIG. 4 shows a test apparatus for evaluating the adhesion of the molding resin to the aluminum heat spreader of the invention.

A test apparatus 70 as illustrated in FIG. 4 was prepared by partially encapsulating two aluminum alloy 3003 strips 72 in a block of molding resin 30. The strips 72 were pulled in opposing directions as illustrated by reference arrows 74 with an Instron tensile tester (Instron Corporation, Canton, Mass.). Test strips 72 were evaluated as both uncoated aluminum alloy 3003 and aluminum alloy 3003 with an integral color anodization layer. Other test strips 72 were encapsulated in the resin block and the molded assembly placed in a pressure cooker at 121° C. and 100% relative humidity. Exposure time to the pressure cooker was 96 hours. Table 1 indicates the force in pounds per square inch required to remove the test strips 72 from the block of molding resin 30.

TABLE 1

| Test Condition | Aluminum Alloy 3003 | | Anodized Aluminum Alloy 3003 | |
| --- | --- | --- | --- | --- |
| | Mean (psi) | Standard Deviation | Mean (psi) | Standard Deviation |
| As cured | 665 | 199 | 966 | 60 |
| 96 hours in pressure cooker | 594 | 187 | 838 | 88 |

Table 1 shows the adhesion of the molding resin 30 to an anodized aluminum heat strip 72 is at least 45% greater than the adhesion of the molding resin to an unanodized aluminum test strip. A similar improvement is observed after pressure cooker exposure.

An additional benefit is noted from the standard deviations recorded on Table 1. More consistent results are achieved after anodization, indicating that the uniform dispersion of surface pores created by integral color anodization presents more uniformity than achieved by the random surface of unprocessed metal.

While the embodiments of the invention described above include a single semiconductor device in thermal contact with the aluminum or aluminum alloy heat spreader, it is within the scope of the invention to have a plurality of semiconductor devices in thermal contact with a single heat spreader. For example, U.S. Pat. No. 5,124,783 to Sawaya, which is incorporated herein by reference in its entirety, discloses a circuit pattern mounted on a die attach paddle. A plurality of semiconductor devices are bonded to the die attach paddle and electrically interconnected to the circuit pattern. The thermal dissipation of the disclosed package would be greatly improved through the use of the heat spreaders of the present invention, thereby permitting the use of higher power semiconductor devices or a greater number or density of devices.

While the preferred embodiments of the invention are drawn to an anodization layer on an aluminum or aluminum alloy substrate, the beneficial effects of the adhesion promoting coating may be applied to other substrates as well. These other substrates include aluminum based composites such as aluminum-silicon carbide and aluminum based compounds such as aluminum nitride.

While the preferred embodiment of the invention is drawn to an anodization layer coating the aluminum or aluminum alloy heat spreader, other coatings which enhance adhesion are also believed to be beneficial. These coatings include chromium, zinc, mixtures of chromium and zinc as well as mixtures of chromium and phosphorous.

One exemplary alternative coating is a co-deposited layer of chromium and zinc. This coating improves the adhesion of a molding resin to a copper or copper alloy substrate as disclosed in commonly assigned U.S. Pat. No. 5,300,158 to Chen et al. The preferred coatings have a zinc to chromium ratio in excess of about 4 to 1.

The co-deposited chromium zinc layer does not provide electrical isolation as achieved by the anodization layer. The co-deposited layer could be deposited over the anodization layer to maintain electrical isolation. Alternatively, if electrical isolation is not necessary, the adhesion enhancing coating may be applied to any heat spreader.

Figure 5:
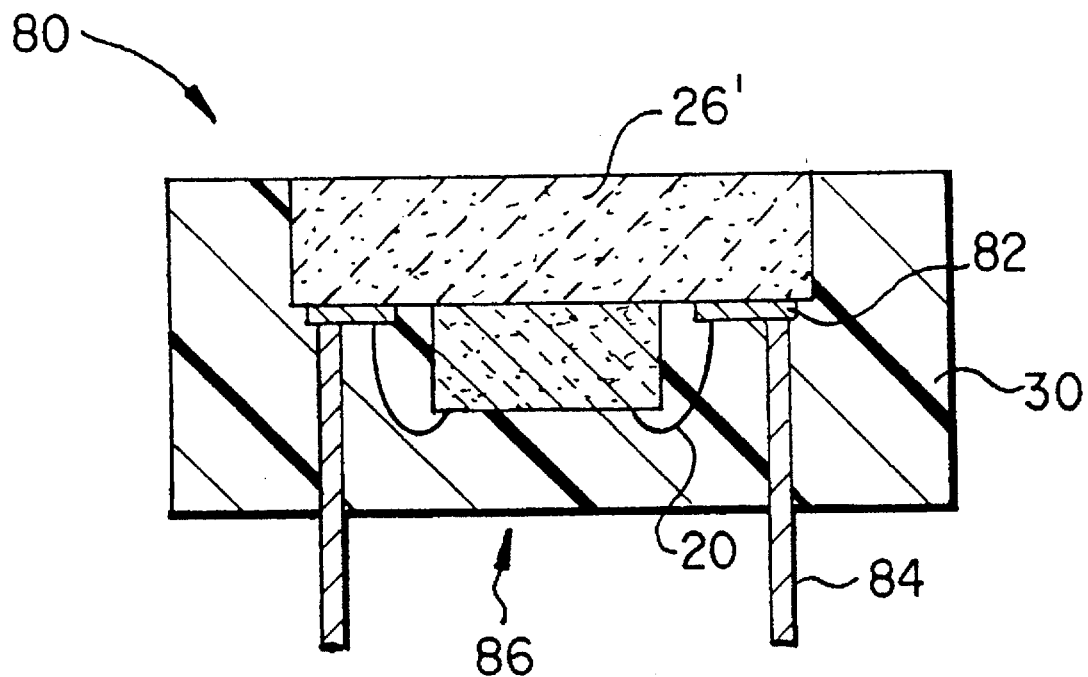
FIG. 5 shows in cross-sectional representation a molded plastic package incorporating a metal/ceramic composite heat slug in accordance with an embodiment of the invention.

While electrical interconnection between the semiconductor device and external circuitry has been described in terms of leadframes, other electrical interconnections such as conductive vias and terminal pins may also be utilized. FIG. 5 illustrates in cross sectional representation one such alternative electrical interconnect. A semiconductor package 80 has a heat slug 26' that, while illustrated as a ceramic/metal composite, may be any thermal dissipator disclosed above. A semiconductor device 12 and circuit traces 82 are bonded to the heat slug 26'. The circuit traces 82 are any conductive material such as copper foil or a palladium/nickel metallization. Bond wires 20 electrically interconnect the semiconductor device 12 to the circuit traces 82. An electrical interconnect 84, here copper alloy terminal pins, is electrically interconnected to the circuit traces 82 and extends at least to the periphery 86 of the package 80. A molding resin encapsulates at least the semiconductor device 12 and a portion of the heat slug 26'.

With any of the electronic packages described herein above, the semiconductor device may be bonded directly to the thermal dissipator or bonded to an intervening die attach pad.

While the electronic package of the invention has been described in terms of packages including a leadframe, it is equally amenable to leadless packages, pin grid array and ball grid array packages.

The patents set forth in this specification are intended to be incorporated by reference herein.

It is apparent that there has been provided in accordance with this invention an anodized aluminum heat spreader which fully satisfies the objects, means and advantages set forth herein before. While the invention has been described in combination with specific embodiments thereof, it is evident that many alternatives, modifications and variations would be those apparent to those skilled in the art in light of the foregoing description. Accordingly, it is intended to embrace all such alternatives, modifications and variations as fall within the spirit and broad scope of the appended claims.

We claim:

1. A semiconductor package, comprising:

at least one semiconductor device bonded to a first side of a thermal dissipator;

said thermal dissipator having a first side and an opposing second side and being selected from the group consisting of aluminum, titanium, zinc, magnesium and alloys thereof with a density less than 5 g/cm$^3$;

an anodization layer coating said thermal dissipator;

a leadframe providing electrical interconnection between said semiconductor device and the exterior of said semiconductor package wherein the thickness of said thermal dissipator is greater than the thickness of said leadframe; and a molding resin encapsulating said semiconductor device and at least a portion of said thermal dissipator.

2. The semiconductor package of claim 1 wherein the coefficient of thermal expansion of said thermal dissipator is no more than twice that of said semiconductor device.

3. The semiconductor package of claim 2 wherein the coefficient of thermal expansion of said thermal dissipator is within about 20% of that of said semiconductor device.

4. The semiconductor package of claim 1 wherein said anodization layer has a thickness of from about 0.008 mm to about 0.04 mm.

5. The semiconductor package of claim 4 wherein said thermal dissipator is titanium or a titanium base alloy.

6. A semiconductor package, comprising:

at least one semiconductor device bonded to a first side of a thermal dissipator;

said thermal dissipator being a metal/ceramic composite having a density of less than 5 g/cm$^3$ and having a first side and an opposing second side;

a leadframe providing electrical interconnection between said semiconductor device and the exterior of said semiconductor package wherein the thickness of said thermal dissipator is greater than the thickness of said leadframe; and a molding resin encapsulating said semiconductor device and at least a portion of said thermal dissipator.

7. The semiconductor package of claim 6 wherein said thermal dissipator is selected from the group consisting of aluminum/silicon carbide, aluminum/aluminum nitride, aluminum/aluminum oxide and aluminum/graphite.

8. The semiconductor package of claim 6 wherein said first surface of said thermal dissipator is electrically conductive.

9. The semiconductor package of claim 6 wherein said thermal dissipator is coated with a coating layer.

10. The semiconductor package of claim 9 wherein said coating layer is aluminum.

11. A semiconductor package, comprising:

at least one semiconductor device bonded to a first side of a thermal dissipator;

said thermal dissipator being formed from a polymer matrix containing thermally conductive fibers and having a first side and an opposing second side;

a leadframe providing electrical interconnection between said semiconductor device and the exterior of said semiconductor package wherein the thickness of said thermal dissipator is greater than the thickness of said leadframe; and a molding resin encapsulating said semiconductor device and at least a portion of said thermal dissipator.

12. The semiconductor package of claim 11 wherein said thermal dissipator is an epoxy matrix containing from about 50% to about 95%, by volume, graphite fibers.

13. A semiconductor package, comprising:

at least one semiconductor device bonded to a first side of a thermal dissipator;

said thermal dissipator being a metal or metal alloy coated with an electrically nonconductive layer selected from the group consisting of oxides and diamond films, said thermal dissipator having a first side and an opposing second side;

a leadframe providing electrical interconnection between said semiconductor device and the exterior of said semiconductor package wherein the thickness of said thermal dissipator is greater than the thickness of said leadframe; and a molding resin encapsulating said semiconductor device and at least a portion of said thermal dissipator.

14. A semiconductor package, comprising:

at least one semiconductor device bonded to a first side of a thermal dissipator;

said thermal dissipator being a metal or metal alloy coated with a corrosion resistant layer selected from the group consisting of carbides, nitrides and carbonitrides, said thermal dissipator having a first side and an opposing second side;

a leadframe providing electrical interconnection between said semiconductor device and the exterior of said semiconductor package wherein the thickness of said thermal dissipator is greater than the thickness of said leadframe; and a molding resin encapsulating said semiconductor device and at least a portion of said thermal dissipator.

15. A semiconductor package, comprising:

at least one semiconductor device;

a metallic heat spreader at least partially coated with an electrically isolating adhesion enhancing layer;

an electrical interconnection selected from the group consisting of conductive vias and terminal pins between said semiconductor device and the exterior of said semiconductor package; and a molding resin encapsulating said semiconductor device, a portion of said conductive vias or terminal pins and a portion of said metallic heat spreader.

16. The semiconductor package of claim 15 wherein said thermal dissipator is aluminum, an aluminum alloy or an aluminum based material.

17. The semiconductor package of claim 16 wherein said adhesion enhancing layer is a co-deposited layer of chromium and zinc.

18. The semiconductor package of claim 16 wherein said adhesion enhancing layer is anodized aluminum.

19. The semiconductor package of claim 15 wherein said heat spreader is formed from copper, a copper alloy or an copper based material.

20. The semiconductor package of claim 19 wherein said thermal dissipator is an ally CuQ where Q is selected from the group titanium, aluminum, chromium, zirconium and silicon and said electrically isolating adhesion enhancing layer is the Q nitride.

* * * * *